(12) United States Patent
Akahane

(10) Patent No.: US 12,411,513 B2
(45) Date of Patent: Sep. 9, 2025

(54) INTEGRATED CIRCUIT AND SEMICONDUCTOR MODULE

(71) Applicant: FUJI ELECTRIC CO., LTD., Kawasaki (JP)

(72) Inventor: Masashi Akahane, Nagano (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 18/303,466

(22) Filed: Apr. 19, 2023

(65) Prior Publication Data

US 2023/0266784 A1    Aug. 24, 2023

Related U.S. Application Data

(63) Continuation of application No. PCT/JP2022/016144, filed on Mar. 30, 2022.

(30) Foreign Application Priority Data

May 14, 2021    (JP) .................................. 2021-082486

(51) Int. Cl.
    *G05F 3/30*    (2006.01)
    *G05F 1/59*    (2006.01)
    *G05F 3/26*    (2006.01)

(52) U.S. Cl.
    CPC ................. *G05F 3/30* (2013.01); *G05F 1/59* (2013.01); *G05F 3/26* (2013.01)

(58) Field of Classification Search
    None
    See application file for complete search history.

(56) References Cited

U.S. PATENT DOCUMENTS

| 4,280,090 A | * | 7/1981 | Lindberg | ............... G05F 3/225 |
| | | | | 323/315 |
| 4,490,670 A | * | 12/1984 | Wong | ...................... G05F 3/30 |
| | | | | 327/535 |
| 4,751,463 A | * | 6/1988 | Higgs | ..................... G05F 3/265 |
| | | | | 361/111 |

(Continued)

FOREIGN PATENT DOCUMENTS

| JP | S5515511 A | 2/1980 |
| JP | 2000-075945 A | 3/2000 |

(Continued)

OTHER PUBLICATIONS

International Search Report for PCT/JP2022/016144, mailed on Jun. 14, 2022.

*Primary Examiner* — Thomas J. Hiltunen
(74) *Attorney, Agent, or Firm* — Rabin & Berdo, P.C.

(57) ABSTRACT

An integrated circuit includes: a power supply line configured to receive a power supply voltage; a constant current source electrically coupled to the power supply line; a reference voltage circuit electrically coupled to the constant current source; and a first resistor having two ends, one end thereof being electrically coupled to the constant current source, and the other end thereof being electrically coupled to the reference voltage circuit. The reference voltage circuit is a bandgap circuit including a plurality pf bipolar devices. The first resistor is configured to decrease a leakage current in the bipolar devices when a temperature thereof rises.

11 Claims, 13 Drawing Sheets

(56) References Cited

U.S. PATENT DOCUMENTS

| | | | | |
|---|---|---|---|---|
| 4,884,161 A * | 11/1989 | Atherton | ................... | G05F 3/30 361/111 |
| 5,119,015 A * | 6/1992 | Watanabe | ................. | G05F 3/30 323/314 |
| 5,168,209 A * | 12/1992 | Thiel, V | ................... | G05F 3/30 327/540 |
| 5,339,020 A * | 8/1994 | Siligoni | ................. | G05F 3/222 323/281 |
| 5,512,817 A * | 4/1996 | Nagaraj | ................. | G05F 3/267 327/539 |
| 5,719,522 A * | 2/1998 | Saitou | ................... | G11C 5/147 327/540 |
| 6,229,376 B1 * | 5/2001 | Geysen | ................. | G05F 3/222 327/403 |
| 6,344,770 B1 * | 2/2002 | Zha | ........................ | G05F 3/30 327/539 |
| 7,336,133 B2 * | 2/2008 | Shor | ...................... | G05F 3/262 330/288 |
| 7,541,862 B2 * | 6/2009 | Fujisawa | ................. | G05F 3/30 327/542 |
| 7,573,324 B2 * | 8/2009 | Kuwano | ................. | G05F 3/30 327/539 |
| 7,656,145 B2 * | 2/2010 | Xiao | ....................... | G05F 3/30 323/280 |
| 7,675,353 B1 * | 3/2010 | Mack | ..................... | G05F 3/30 327/539 |
| 8,248,176 B2 * | 8/2012 | Takano | ................. | G05F 3/242 331/66 |
| 9,568,933 B2 * | 2/2017 | Pottbaecker | .............. | G05F 3/08 |
| 10,088,856 B2 * | 10/2018 | Xu | .............. | G05F 1/56 |
| 10,955,868 B2 * | 3/2021 | Brule | ........................ | G05F 3/30 |
| 11,662,761 B2 * | 5/2023 | Sawai | ..................... | G05F 3/262 323/313 |
| 2005/0140428 A1 | 6/2005 | Tran | | |
| 2006/0256494 A1 * | 11/2006 | Mori | ................... | H01L 27/0248 361/103 |
| 2009/0160557 A1 * | 6/2009 | Luzzi | ..................... | G05F 3/262 330/288 |
| 2013/0187628 A1 | 7/2013 | Furusawa et al. | | |
| 2014/0152288 A1 * | 6/2014 | Song | ....................... | G05F 3/185 323/313 |
| 2015/0177770 A1 | 6/2015 | Furusawa et al. | | |
| 2015/0236686 A1 | 8/2015 | Senda | | |
| 2018/0152138 A1 | 5/2018 | Sugita et al. | | |
| 2019/0317542 A1 * | 10/2019 | Brule | ....................... | G05F 3/18 |
| 2021/0034092 A1 * | 2/2021 | Tomioka | ................ | G05F 3/185 |
| 2023/0333587 A1 * | 10/2023 | Hirose | ..................... | H03F 1/30 |

FOREIGN PATENT DOCUMENTS

| | | |
|---|---|---|
| JP | 2005-202704 A | 7/2005 |
| JP | 2005196738 A | 7/2005 |
| JP | 2007094800 A | 4/2007 |
| JP | 2010124597 A | 6/2010 |
| JP | 2013-149197 A | 8/2013 |
| JP | 2015154701 A | 8/2015 |
| JP | 2018055348 A | 4/2018 |
| JP | 2018-088037 A | 6/2018 |

* cited by examiner

INTEGRATED CIRCUIT AND SEMICONDUCTOR MODULE

CROSS-REFERENCE TO RELATED APPLICATION

This is a continuation application of International Patent Application No. PCT/JP2022/016144 filed Mar. 30, 2022, which claims the benefit of priority to Japanese Patent Application No. 2021-082486 filed May 14, 2021, the entire contents of each of which the entire contents of each of which are incorporated herein by reference.

BACKGROUND

Technical Field

The present disclosure relates to an integrated circuit and a semiconductor module.

Description of the Related Art

Reference voltage circuits utilizing bandgap voltage of semiconductor are known (see, for example, Japanese Patent Application Publication No. 2005-202704).

In bandgap reference voltage circuits including bipolar transistors, when the temperature of such a bipolar transistor rises, leakage current may be generated between an N-well region covering a collector terminal and a substrate. Accordingly, the current outputted from the substrate of such a reference voltage circuit may increase, and the voltage outputted from the reference voltage circuit may also rise.

SUMMARY

A first aspect of an embodiment of the present disclosure is to provide an integrated circuit comprising: a power supply line configured to receive a power supply voltage; a constant current source electrically coupled to the power supply line; a reference voltage circuit electrically coupled to the constant current source; and a first resistor having two ends, one end thereof being electrically coupled to the constant current source, and the other end thereof being electrically coupled to the reference voltage circuit, wherein the reference voltage circuit is a bandgap circuit including a plurality of bipolar devices, and the first resistor is configured to decrease a leakage current in the plurality of bipolar devices when a temperature rises.

A second aspect of an embodiment of the present disclosure is to provide a semiconductor module comprising the integrated circuit.

Note that the above summary does not list all of the features of the present disclosure. Subcombinations of these feature groups may also be the disclosure.

BRIEF DESCRIPTION OF THE DRAWINGS

FIG. 2 illustrates an example of a circuit diagram of a voltage generator circuit 40a.

FIG. 5 is an example of a schematic diagram illustrating change with temperature in currents and voltages in a voltage generator circuit 40a.

DETAILED DESCRIPTION

Hereinafter, the present disclosure will be described through embodiments of the disclosure. However, the following embodiments do not limit the disclosure according to the scope of the claims. In addition, not all the combinations of the features described in the embodiments are necessarily essential for solution in the disclosure.

Herein, the terms "electrically couple" and "couple" are used, and the term "couple" means to "electrically couple" unless otherwise noted.

EMBODIMENT EXAMPLES

Configuration Example of Semiconductor Module 10

Figure 1:
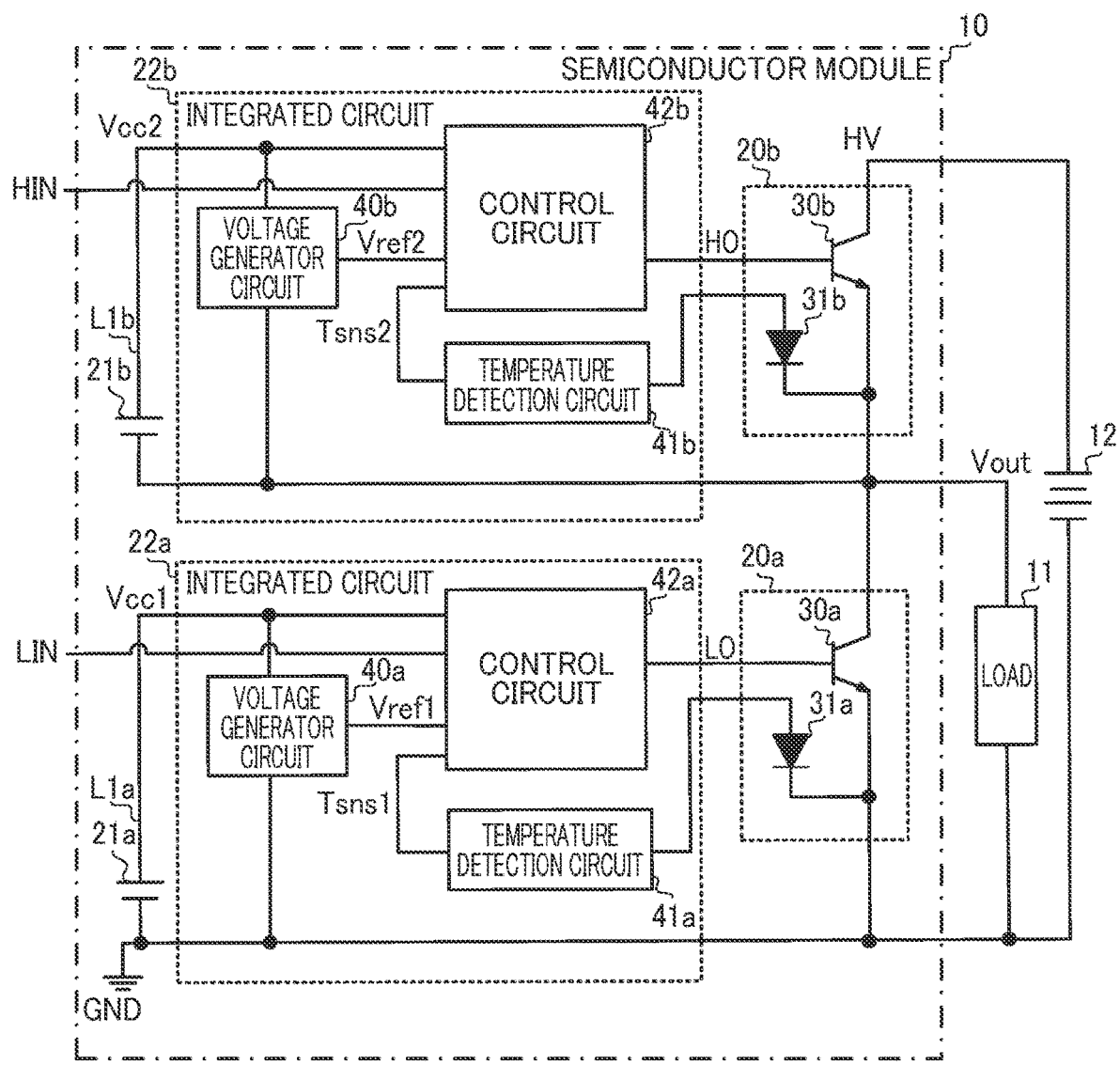
FIG. 1 illustrates an example of a configuration of a semiconductor module 10.

FIG. 1 illustrates an example of a configuration of a semiconductor module 10. The semiconductor module 10 is a module to drive a load 11 in response to an instruction from an externally provided microcomputer (not illustrated).

The semiconductor module 10 uses an externally provided power supply 12 as a main power supply. The power supply 12 applies a voltage HV to the semiconductor module 10. The semiconductor module 10 includes semiconductor chips 20a, 20b, power supplies 21a, 21b, and the integrated circuits 22a, 22b.

Here, among the chips and the like configuring the semiconductor module 10, the semiconductor chip 20a, the power supply 21a, and the integrated circuit 22a are provided on the low side, and the semiconductor chip 20b, the power supply 21b, and the integrated circuit 22b are provided on the high side. Further, in an embodiment of the present disclosure, the circuits on the low side and the circuits on the high side are the same in configuration, and thus the following mainly describes the circuits on the low side.

The load 11 is, for example, a motor coil, and is driven by a voltage Vout outputted from a node of contact between the semiconductor chips 20a and 20b.

The semiconductor chip 20a includes a switching device to drive the load 11 and a temperature sensing element. The semiconductor chip 20a according to an embodiment of the present disclosure includes an insulated gate bipolar transistor (IGBT) 30a as the switching device, and a diode 31a for the IGBT 30a as the temperature sensing element.

However, the switching device provided in the semiconductor chip 20a is not limited to the IGBT 30a, and the switching device may be a metal-oxide-semiconductor (MOS) transistor or a bipolar transistor. Further, the semiconductor chip 20a may include a diode to communicate load current to the IGBT 30a.

The power supply 21a is a power supply for the integrated circuit 22a, and applies the power supply voltage Vcc1 to a power supply line L1a. Note that the power supply 21a according to an embodiment of the present disclosure is generated by a power supply circuit (not illustrated) provided inside the semiconductor module 10, but may be supplied from the outside, for example.

The integrated circuit 22a is a low-voltage integrated circuit (LVIC), and outputs a driving signal LO to the gate electrode of the IGBT 30a in response to signal LIN inputted from a microcomputer (not illustrated), to thereby control the IGBT 30a. The integrated circuit 22a includes a voltage generator circuit 40a, a temperature detection circuit 41a, and a control circuit 42a.

The voltage generator circuit 40a according to an embodiment of the present disclosure generates a reference voltage Vref1, based on the power supply voltage Vcc1 of the power supply line L1a.

The temperature detection circuit 41a supplies predetermined current to the diode 31a, and outputs a temperature sensing signal Tsns1 corresponding to the temperature of the IGBT 30a to the control circuit 42a, based on the forward voltage of the diode 31a.

The control circuit 42a controls the operation of the IGBT 30a, based on the signal LIN from the microcomputer (not illustrated), the reference voltage Vref1, and the temperature sensing signal Tsns1.

Specifically, the control circuit 42a controls switching of the IGBT 30a in response to the signal LIN. In addition, the control circuit 42a detects overheating of the semiconductor chip 20a, based on the reference voltage Vref1 and the temperature sensing signal Tsns1. When detecting overheating of the semiconductor chip 20a, the control circuit 42a protects the IGBT 30a from heat by turning off the IGBT 30a, for example.

The semiconductor chip 20b includes an IGBT 30b and a diode 31b, as corresponding components on the high side, and the power supply 21b applies a power supply voltage Vcc2 to a power supply line L1b. Further, the integrated circuit 22b includes a voltage generator circuit 40b, a temperature detection circuit 41b, and a control circuit 42b.

The voltage generator circuit 40b supplies a reference voltage Vref2 to the control circuit 42b, as in the voltage generator circuit 40a. The temperature detection circuit 41b outputs a temperature sensing signal Tsns2 corresponding to the temperature of the IGBT 30b to the control circuit 42b, based on the forward voltage of the diode 31b, as in the temperature detection circuit 41a. The control circuit 42b controls the operation of the IGBT 30b, based on a signal HIN from the microcomputer (not illustrated), the reference voltage Vref2, and the temperature sensing signal Tsns2. The control circuit 42b includes a level converter circuit to convert the signal HIN whose reference voltage is GND into a signal whose reference voltage is Vout.

As such, the voltage generator circuit 40b and the temperature detection circuit 41b have the same functions and configurations as the voltage generator circuit 40a and the temperature detection circuit 41a have, respectively.

Accordingly, the description of the integrated circuit 22b, which includes the voltage generator circuit 40b, the temperature detection circuit 41b, and the control circuit 42b on the high side, is omitted below.

Configuration Example of Voltage Generator Circuit 40a

Figure 2:
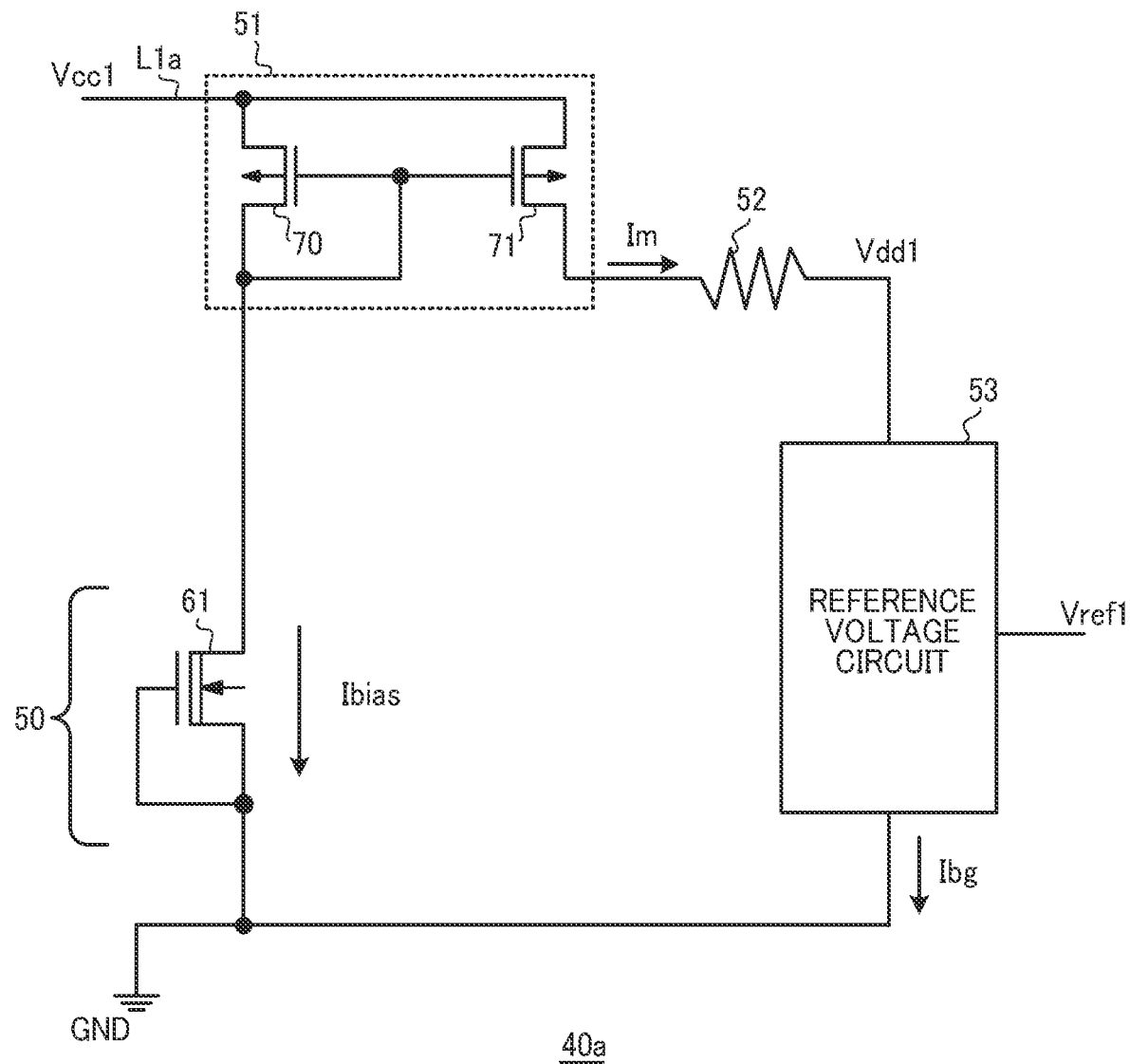

FIG. 2 illustrates an example of a circuit diagram of the voltage generator circuit 40a. The voltage generator circuit 40a generates the temperature-compensated reference voltage Vref1 of a predetermined level. The voltage generator circuit 40a according to an embodiment of the present disclosure includes a bias current source 50a, a current mirror circuit 51, a resistor 52, and a reference voltage circuit 53.

The bias current source 50a generates a predetermined bias current Ibias. A bias current source 50 according to an embodiment of the present disclosure includes a depletion type MOS transistor 61 whose gate terminal and source terminal are diode-coupled.

Here, the bias current source 50a is configured with a single device, in other words, the depletion type MOS transistor 61. Accordingly, with the use of the bias current source 50a according to an embodiment of the present disclosure, the circuit size of the voltage generator circuit 40a is reduced.

The current mirror circuit 51 supplies constant current Im to the reference voltage circuit 53, based on the bias current Ibias. The current mirror circuit 51 is electrically coupled to the power supply line L1a, to which the power supply voltage Vcc1 is applied. The current mirror circuit 51 according to an embodiment of the present disclosure includes a MOS transistor 70, through which the bias current Ibias flows, and a MOS transistor 71. Note that the MOS transistors 70, 71 according to an embodiment of the present disclosure are P-channel metal-oxide-semiconductor (PMOS) transistors.

The gate terminal and source terminal of the MOS transistor 70 are diode-coupled. The gate terminal of the MOS transistor 70 and the gate terminal of the MOS transistor 71 are electrically coupled each other. Accordingly, based on the bias current Ibias flowing through the MOS transistor 70, the current Im is supplied from the MOS transistor 71.

The resistor 52 generates voltage Vdd1 to operate the reference voltage circuit 53, from the current Im of the current mirror circuit 51. The resistor 52 has one end electrically coupled to the current mirror circuit 51, and the other end electrically coupled to the reference voltage circuit 53.

The reference voltage circuit 53 outputs the reference voltage Vref1, which is to be used in other circuits, based on the inputted current Im and voltage Vdd1. Note that, although details will be described later, in the reference voltage circuit 53 according to an embodiment of the present disclosure, a node different from a node from which the reference voltage Vref1 is to be outputted is grounded. Accordingly, when leakage current is not generated in the reference voltage circuit 53, the current Ibg results in the current Im.

Note that the current mirror circuit 51 according to an embodiment of the present disclosure corresponds to a "constant current source", and the current Im corresponds to "first current". Further, the MOS transistor 70 corresponds to a "first MOS transistor", the MOS transistor 71 corresponds to a "second MOS transistor". Further, the resistor 52 corresponds to a "first resistor".

Here, a description has been given, as an example, of the voltage generator circuit 40a on the low side, which uses the power supply voltage Vcc1, the power supply line L1a, GND as a power supply reference voltage, the power supply line L1a and the reference voltage Vref1 to be outputted. The voltage generator circuit 40b on the high side also has a similar configuration using the power supply voltage Vcc2, the power supply line L1b, Vout as a power supply reference voltage, and the reference voltage Vref2 to be outputted in place of those on the low side.

Configuration Example of Reference Voltage Circuit 53

Figure 3:
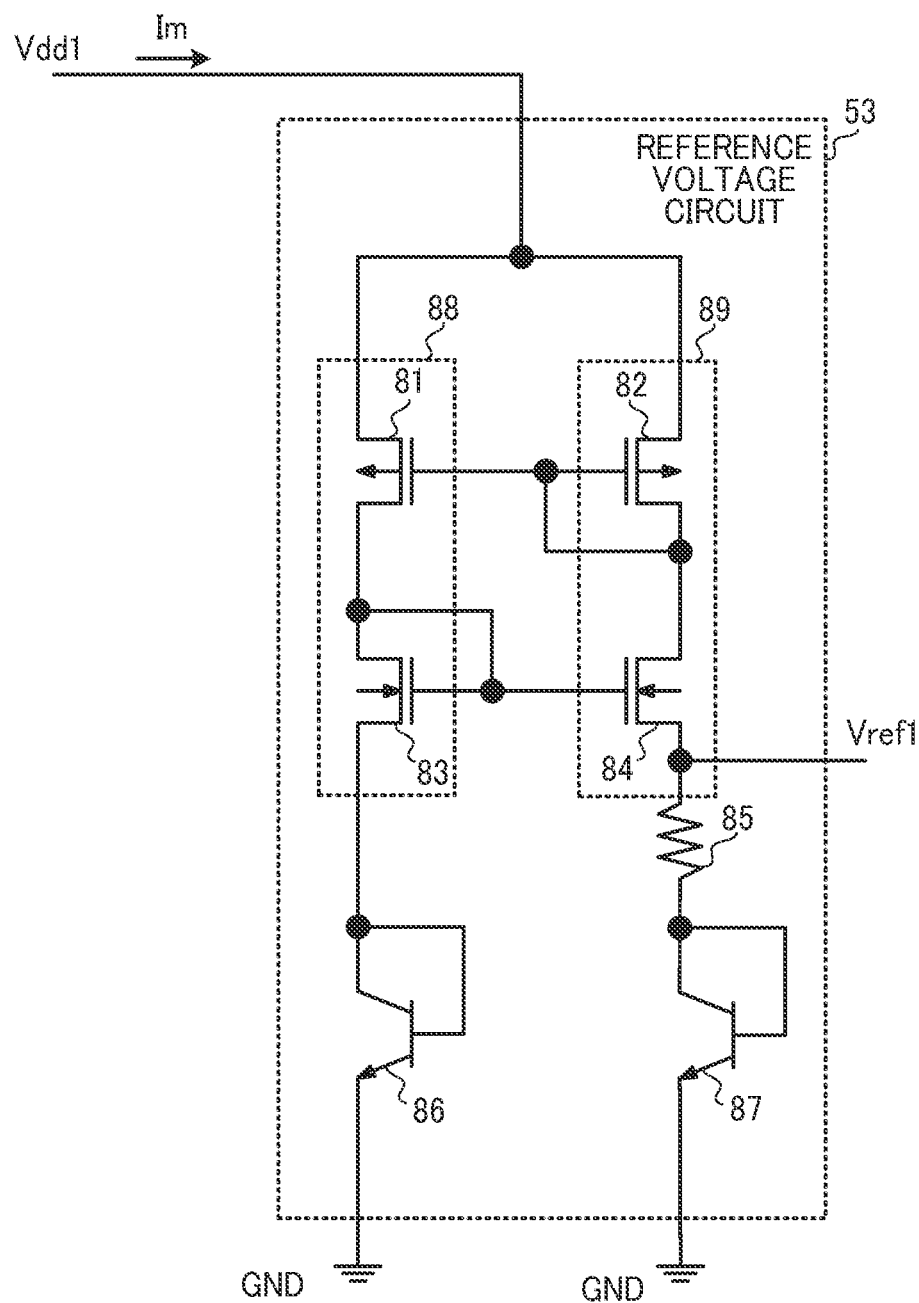
FIG. 3 illustrates an example of a circuit diagram of a reference voltage circuit 53.

FIG. 3 illustrates an example of a circuit diagram of the reference voltage circuit 53. The reference voltage circuit 53 according to an embodiment of the present disclosure includes MOS transistors 81 to 84, a resistor 85, and bipolar transistors 86, 87. In other words, the reference voltage circuit 53 according to an embodiment of the present disclosure is a bandgap circuit including bipolar devices. Note that the MOS transistors 81, 82 according to an embodiment of the present disclosure are PMOS transistors, and the MOS transistors 83, 84 are NMOS transistors.

The gate terminal and source terminal of each of the MOS transistors 82, 83 are diode coupled. The MOS transistors 81, 82 configure a P-channel current mirror circuit, and the MOS transistors 83, 84 configure an N-channel current mirror circuit.

In response to the current Im being supplied to the diode-coupled MOS transistor 82 from the current mirror circuit 51, the MOS transistor 81 is turned on. Accordingly, the MOS transistor 81 outputs current, based on the current flowing through the MOS transistor 82. As a result, the MOS transistors 81, 82 supply current to the MOS transistors 83, 84, respectively.

Further, in response to the current being supplied to the diode-coupled MOS transistor 83, the MOS transistor 84 is turned on. Accordingly, the MOS transistor 84 outputs current, based on the current flowing through the MOS transistor 83. As a result, the MOS transistor 83 supplies current to the bipolar transistor 86, and the MOS transistor 84 supplies current to the resistor 85.

Further, in an embodiment of the present disclosure, the MOS transistors 81, 82 have the same size, and the MOS transistors 83, 84 have the same size. Accordingly, the currents from the current mirror circuit including the MOS transistors 83, 84 are equal to each other.

Accordingly, the current Im from the current mirror circuit 51 is supplied to the MOS transistors 81, 83, and the MOS transistors 81, 83 can be considered as configuring a current source 88 to supply current to the bipolar transistor 86. The current source 88 according to an embodiment of the present disclosure corresponds to a "first current source".

Similarly, the current Im from the current mirror circuit 51 is supplied to the MOS transistors 82, 84, and the MOS transistors 82, 84 can be considered as configuring a current source 89 to supply current to the resistor 85. Further, the current source 89 is electrically coupled in parallel with the current source 88. The current source 89 according to an embodiment of the present disclosure corresponds to a "second current source".

Here, the current source 88, 89 is a current source in which the magnitude of the current to be outputted changes with the level of the power supply voltage Vdd1 applied to the current source 88, 89, unlike such a "constant current source" as the current mirror circuit 51 configured to generate the current Im, based on the bias current Ibias. In other words, herein, the "current source" is different from the "constant current source" in that although current is supplied, the magnitude of the current to be supplied is not constant.

The resistor 85 has one end coupled to the output of the MOS transistor 84, and the other end coupled to the collector terminal of the bipolar transistor 87. The current from the MOS transistor 84 is supplied to the resistor 85, and the resistor 85 is electrically coupled to the bipolar transistor 87.

The base terminal and collector terminal of the bipolar transistor 86 are electrically coupled and the base terminal and collector terminal of the bipolar transistor 87 are electrically coupled, and the emitter terminals of the bipolar transistors 86, 87 are grounded.

The bipolar transistors 86, 87 are respectively configured such that the base-emitter voltages thereof are different from each other. Specifically, the bipolar transistor 86 according to an embodiment of the present disclosure includes a single bipolar transistor, meanwhile the bipolar transistor 87 includes a plurality of bipolar transistors coupled in parallel. Accordingly, the base-emitter voltage of the bipolar transistor 86 is greater than the base-emitter voltage of the bipolar transistor 87. Note that both of the base-emitter voltages of the bipolar transistors 86, 87 have positive temperature coefficients.

Further, in an embodiment of the present disclosure, the currents from the current sources 88, 89 are equal to each other, which results in the voltages at source terminals of the MOS transistors 83, 84 being equal to each other. Accordingly, voltage with a negative temperature coefficient is generated across the resistor 85, in accordance with the difference between the base-emitter voltage of the bipolar transistor 86 and the base-emitter voltage of the bipolar transistor 87.

As a result, the voltage obtained by adding the base-emitter voltage of the bipolar transistor 87 with a positive temperature coefficient and the voltage across the resistor 85 with a negative temperature coefficient is generated, as the reference voltage Vref1, at the node at which the MOS transistor 84 and the resistor 85 are coupled. Note that, in an embodiment of the present disclosure, for example, the resistance value of the resistor 85 and the number of the bipolar transistors 87 are adjusted such that the temperature coefficient of the reference voltage Vref1 is zero.

Accordingly, the temperature-compensated reference voltage Vref1 is supplied from the reference voltage circuit 53.

The resistor 85 according to an embodiment of the present disclosure corresponds to a "second resistor". Further, the bipolar transistor 86 corresponds to a "first bipolar transistor", and the bipolar transistor 87 corresponds to a "second bipolar transistor".

As described above, the reference voltage circuit 53 according to an embodiment of the present disclosure is capable of outputting the temperature-compensated reference voltage Vref1. Incidentally, when a temperature rises, the leakage current is generated from the bipolar transistors 86, 87, which may cause the reference voltage Vref1 to fluctuate greatly in accordance with the temperature. The following describes the leakage current generated in the bipolar transistors 86, 87.

Leakage Current Generated in Bipolar Transistor

Figure 4:
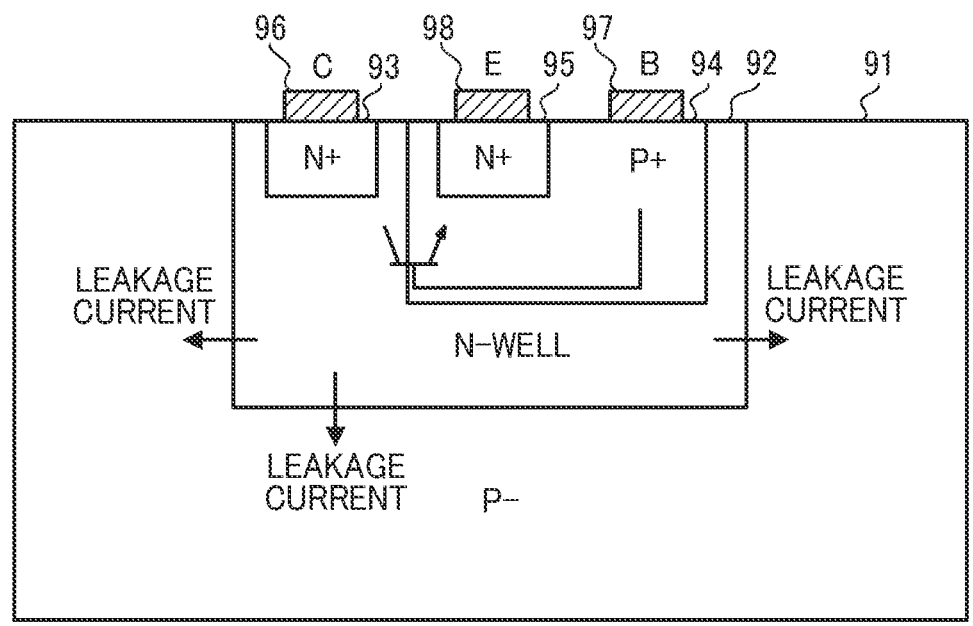
FIG. 4 is an example of a conceptual diagram illustrating generation of leakage current in a bipolar transistor 87 of a reference voltage circuit 53.

FIG. 4 is an example of a conceptual diagram illustrating generation of the leakage current in the bipolar transistor 87 of the reference voltage circuit 53. In an embodiment of the present disclosure, the bipolar transistor 87 is formed such that an N-well region 92 is provided in a substrate 91 in the semiconductor, and a dopant diffusion region for each terminal to function is provided in the N-well region 92. In an embodiment of the present disclosure, the substrate 91 has P-type conductivity.

An N+ collector region 93 is provided around a region in which a collector terminal 96 is provided in the N-well region 92, and a P+ base region 94 is provided around a region in which a base terminal 97 is provided. Further, an N+ emitter region 95 is provided around a region in which an emitter terminal 98 is provided in the P+ base region 94.

Note that, in a region marked with each conductivity type, a region prefixed with "+" means that a doping concentration therein is higher than that in a region without "+", and a region prefixed with "−" means that a doping concentration therein is lower than that in a region without In the bipolar transistor 87 as such, the surface area of a PN junction portion between the substrate 91 and the N-well region 92 is large. When the temperature of a semiconductor device rises, the larger the surface area of the PN junction portion, the greater the possibility of the leakage current being generated. Accordingly, in the bandgap reference voltage circuit 53 using bipolar devices, it is effective to reduce the leakage current.

In the bipolar transistor 87, the current flowing from the collector terminal 96 into the bipolar transistor is reduced, thereby being able to restrain the leakage current even when the temperature rises. Accordingly, the current Im inputted to the reference voltage circuit 53 is reduced and the voltage Vdd1 is lowered, thereby restraining the leakage current.

Note that the bias current source 50a and the current mirror circuit 51 according to an embodiment of the present disclosure include no bipolar device, and thus the voltage generator circuit 40a is configured such that the leakage current is less likely to be generated from those other than the reference voltage circuit 53.

Further, the bipolar transistor 87 is used as an example, to explain the mechanism of the leakage current in the bipolar device in the reference voltage circuit 53, however, the leakage current may be generated based on a similar mechanism, in the bipolar transistor 86 as well. As such, in an embodiment of the present disclosure, the term "the leakage current" indicates the current flowing from the N-well region 92 to the substrate 91 when a bipolar transistor is formed, for example.

Figure 5:
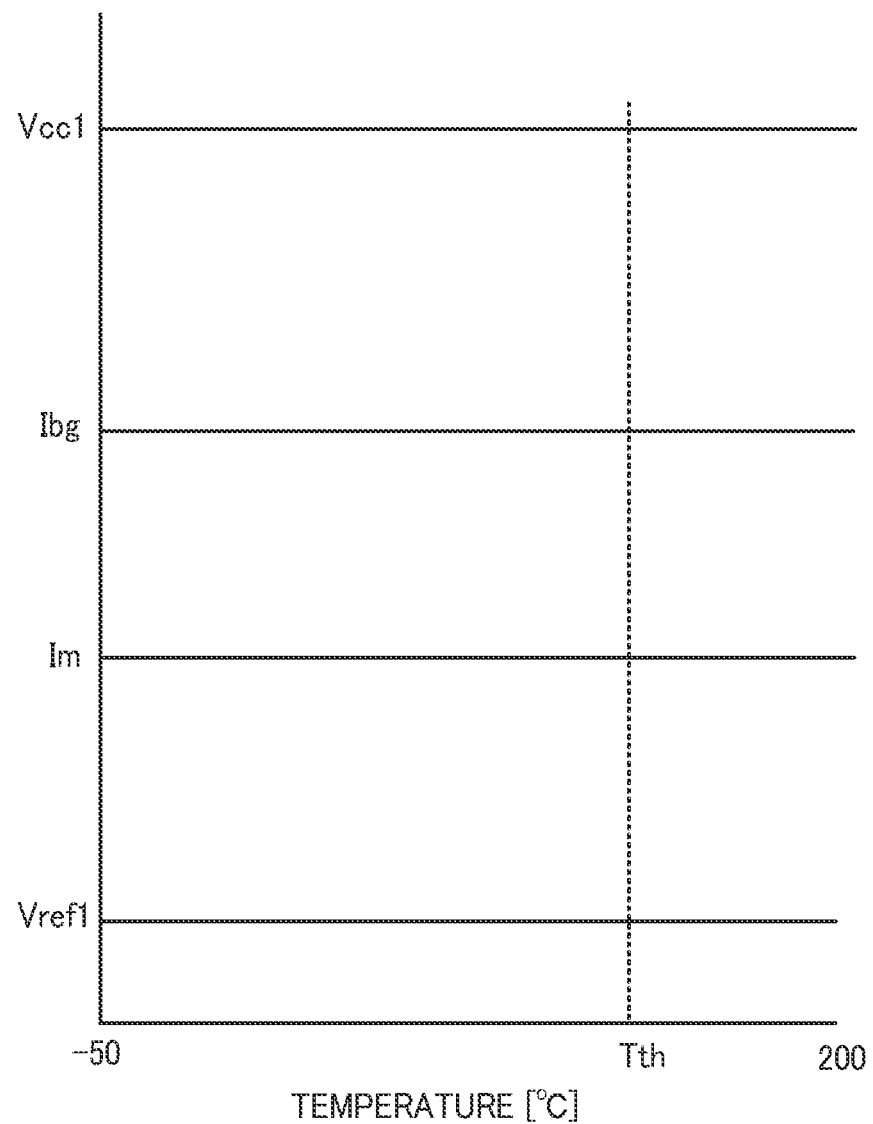

Change with Temperature in Current and Voltage Values In Voltage Generator Circuit 40a of Embodiment Example FIG. 5 is an example of a schematic diagram illustrating change with temperature in current values and voltage values in the voltage generator circuit 40a. An embodiment of the present disclosure illustrates the relationship among the power supply voltage Vcc1, current Ibg, the current Im, and the reference voltage Vref1 when a temperature T [° C.] of the reference voltage circuit 53 is changed.

The current Ibg is the current flowing from the reference voltage circuit 53 to the ground. The substrate 91 of the bipolar transistor 87 is grounded, and thus when the leakage current flowing from the substrate 91 to the ground explained with reference to FIG. 4 increases, the current Ibg increases.

Note that the substrate of the bipolar transistor 86 is also grounded, and thus even when the leakage current in the bipolar transistor 86 increases as well, the current Ibg increases.

A temperature threshold value Tth is a temperature value at which the leakage current flowing from the bipolar device of the reference voltage circuit 53 to the ground is generated. Here, in an embodiment of the present disclosure, the phrase "the leakage current is generated" indicates, for example, that the value of the current flowing from the N-well region 92 when the bipolar transistor is formed to the substrate 91 (hereinafter, referred to as current Ix) reaches a predetermined multiple (e.g., 5 times) of the current Ix when a temperature is a predetermined temperature (e.g., 25° C.)

In an embodiment of the present disclosure, the temperature threshold value Tth at which the leakage current is generated is 100° C., however, it varies depending on the configuration of the bipolar transistor and/or the dopant concentration in the substrate 91 and/or the N-well region 92. Accordingly, the temperature threshold value Tth may not be 100° C., but may be other temperatures such as 120° C. or the like.

In the voltage generator circuit 40a, the small constant current Im based on the bias current Ibias is provided from the current mirror circuit 51 to the reference voltage circuit 53. Accordingly, even in a temperature range above the temperature threshold value Tth, the leakage current from the reference voltage circuit 53 is restrained, and the current Ibg results in being substantially the same as the current Im. The current Im is determined such that the current Ibg is limited to the value of the current Im, when the temperature becomes equal to or higher than the temperature threshold value Tth at which the leakage current flowing from the reference voltage circuit 53 to the ground is generated.

Even when the temperature exceeds the temperature threshold value Tth, the value of the current Ibg is substantially the same as the value of the current Im. As a result, the current flowing through the resistor 85 is substantially constant, irrespective of temperature. Accordingly, even when the reference voltage circuit 53 changes in temperature, the reference voltage Vref1 generated from the reference voltage circuit 53 is also substantially constant.

Note that, in an embodiment of the present disclosure, the resistor 52 is provided between the current mirror circuit 51 and the reference voltage circuit 53. Accordingly, the voltage Vdd1 supplied to the reference voltage circuit 53 is lower than that when the resistor 52 is not provided. This lowers the voltages at the nodes in the reference voltage circuit 53, and lowers the voltages applied to the collector terminals of the bipolar transistors 86, 87 as well.

The lower the voltages applied to the collector terminals of the bipolar transistors 86, 87, the smaller the leakage current. Accordingly, in an embodiment of the present disclosure, by lowering the voltage Vdd1 applied as power supply for the reference voltage circuit 53, the leakage current can be reduced smaller. This makes it possible to generate the temperature-compensated reference voltage Vref1 with high accuracy.

Comparative Example

Voltage Generator Circuit 110 of Comparative Example

Figure 6:
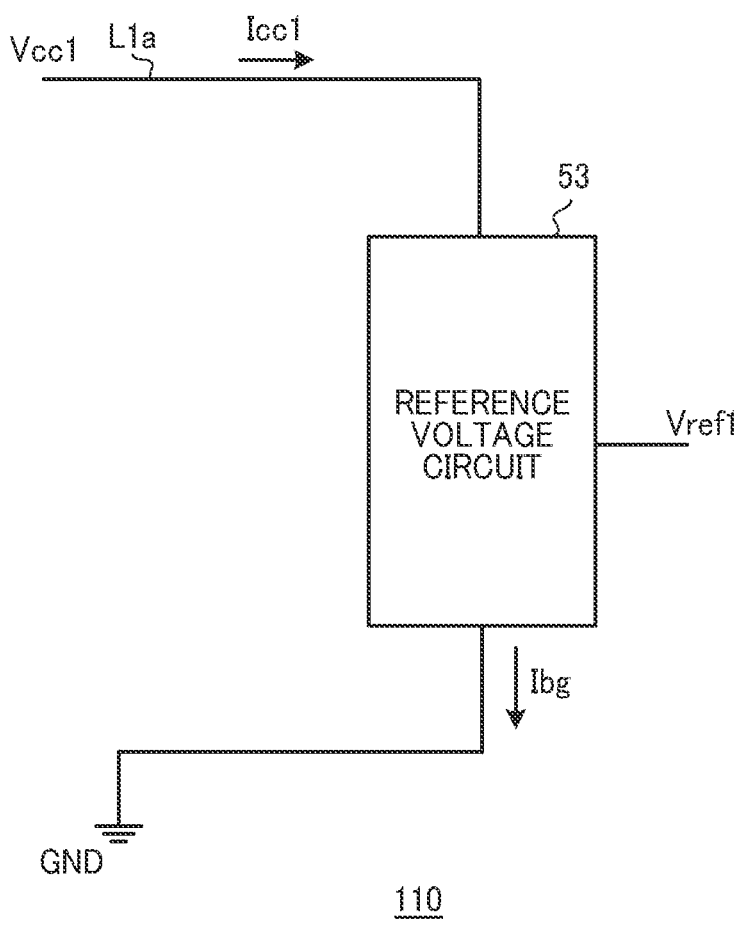
FIG. 6 illustrates an example of a circuit diagram of a voltage generator circuit 110 according to a comparative example.

FIG. 6 illustrates an example of a circuit diagram of a voltage generator circuit 110 according to a comparative example. The following mainly describes differences between the voltage generator circuit 110 and the voltage generator circuit 40a.

The voltage generator circuit 110 of a comparative example does not include the current mirror circuit 51 or the resistor 52. In other words, the reference voltage circuit 53 of the voltage generator circuit 110 according to a comparative example is directly electrically coupled to the power supply line L1a to supply the power supply voltage Vcc1.

Current Icc1 is supplied from the power supply line L1a to the reference voltage circuit 53. The current Icc1 corresponds to a "second current".

Figure 7:
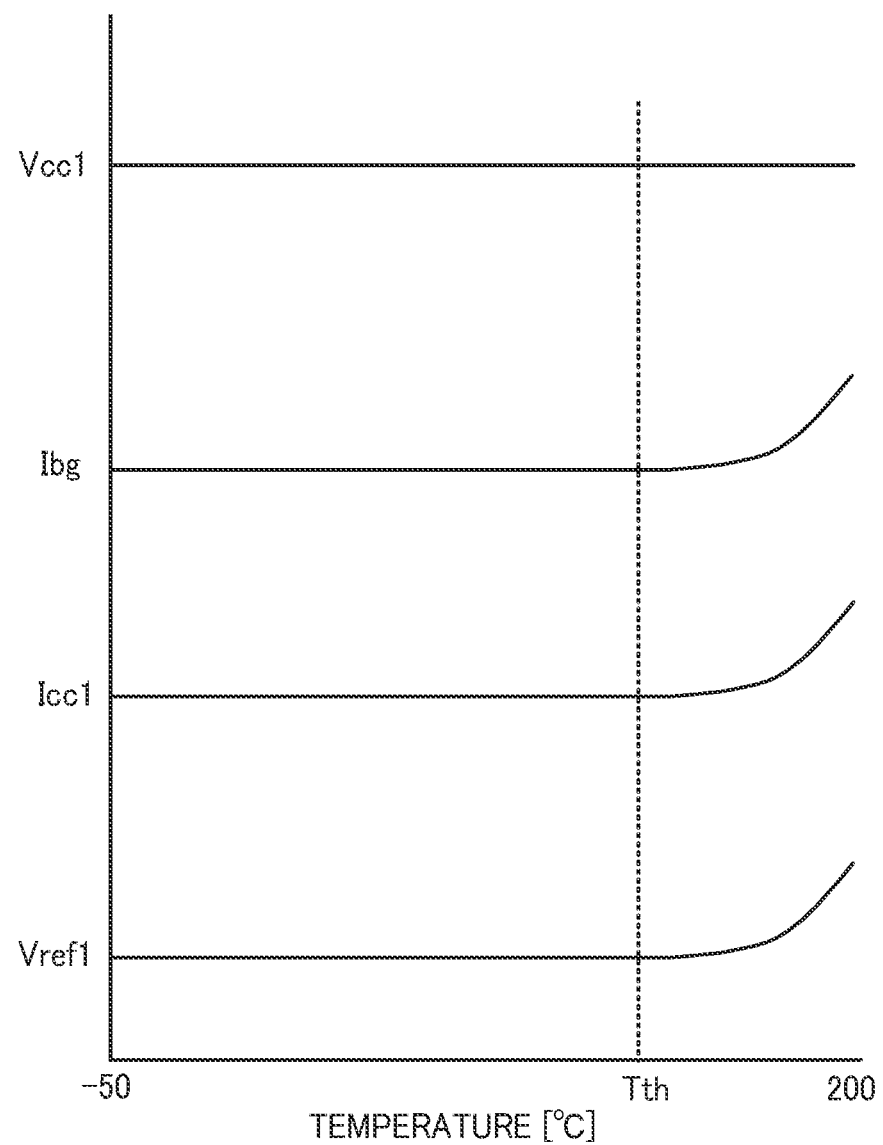
FIG. 7 is an example of a schematic diagram illustrating change with temperature in currents and voltages in a voltage generator circuit 110.

FIG. 7 is an example of a schematic diagram illustrating change with temperature in currents and voltages in the voltage generator circuit 110. FIG. 7 illustrates the power supply voltage Vcc1, the current Ibg, the current Icc1 from the power supply line L1a, and the reference voltage Vref1 when the temperature T [° C.] of the reference voltage circuit 53 is changed.

In the voltage generator circuit 110, the leakage current is generated from the bipolar devices provided in the reference voltage circuit 53, in the temperature range above the temperature threshold value Tth. This increases the current Ibg flowing from the reference voltage circuit 53 toward the ground.

The voltage generator circuit 110 includes no mechanism to limit an increase in the current Icc1. Accordingly, in response to the current Ibg being generated, the current Icc1 supplied from the power supply line L1a to the reference voltage circuit 53 increases as well. At a predetermined temperature in the temperature range above the temperature threshold value Tth, the current value of the current Icc1 exceeds the current value of the current Im in the voltage generator circuit 40a.

In the voltage generator circuit 110, in accordance with an increase in the current Ibg with a rise in the temperature, the reference voltage Vref1 from the reference voltage circuit 53 rises as well. Meanwhile, the voltage generator circuit 40a in FIG. 2 can provide the reference voltage Vref1 with less temperature dependence, as compared with the voltage generator circuit 110.

Relationship Between Im In Embodiment Example and Ibg In Comparative Example

Figure 8:
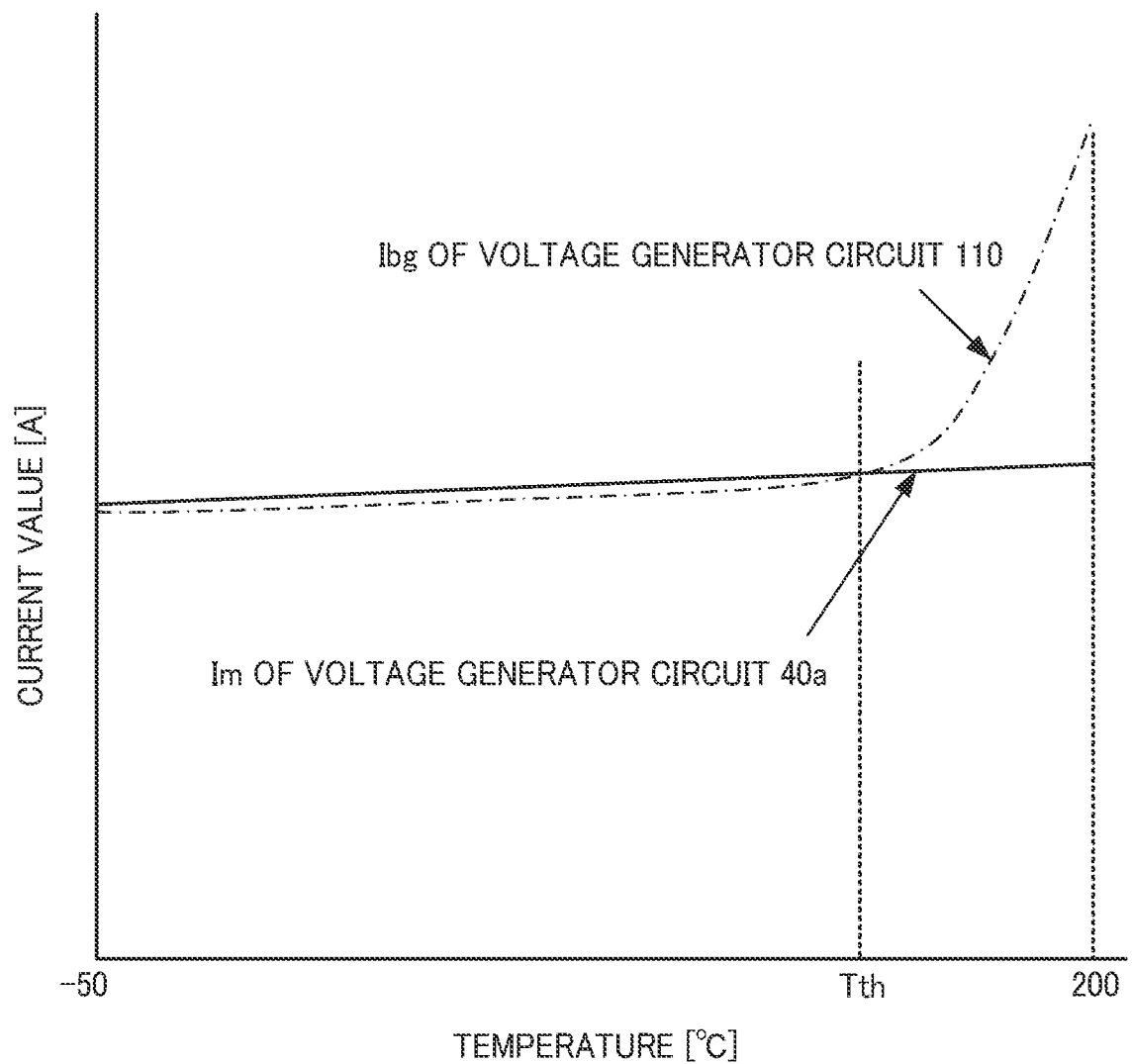
FIG. 8 is an example of a schematic diagram illustrating change with temperatures of current Im of a voltage generator circuit 40a and current Ibg of a voltage generator circuit 110.

FIG. 8 is an example of a schematic diagram illustrating change with temperature in the current Im of the voltage generator circuit 40a and the current Ibg of the voltage generator circuit 110. In FIG. 8, the translation of the current Im in the voltage generator circuit 40a is given by a solid line, and the translation of the current Ibg of the voltage generator circuit 110 is given by a dashed-dotted line.

In the voltage generator circuit 110, in response to the leakage current being generated, the current Ibg also increases in the temperature range above the temperature threshold value Tth. Meanwhile, in the voltage generator circuit 40a, the current Ibg is limited to the current Im in the range above the temperature threshold value Tth as well.

The current Im in the voltage generator circuit 40a according to an embodiment of the present disclosure is considered as current sufficient to operate the reference voltage circuit 53. However, if the value of the current Im is increased excessively, the current Ibg cannot be limited when the current Ibg increases with the temperature becoming equal to or higher than the temperature threshold value Tth, for example.

Thus, in an embodiment of the present disclosure, the current value of the current Im is determined such that the current value of the current Ibg in the voltage generator circuit 110 when the temperature is at the temperature threshold value Tth is the current value of the current Im, for example. With the value of the current Im being set as such, it is possible to restrain an increase in the leakage current in the reference voltage circuit 53 with reliability.

Modified Example of Embodiment Example

Configuration of Voltage Generator Circuit 40c

Figure 9A:
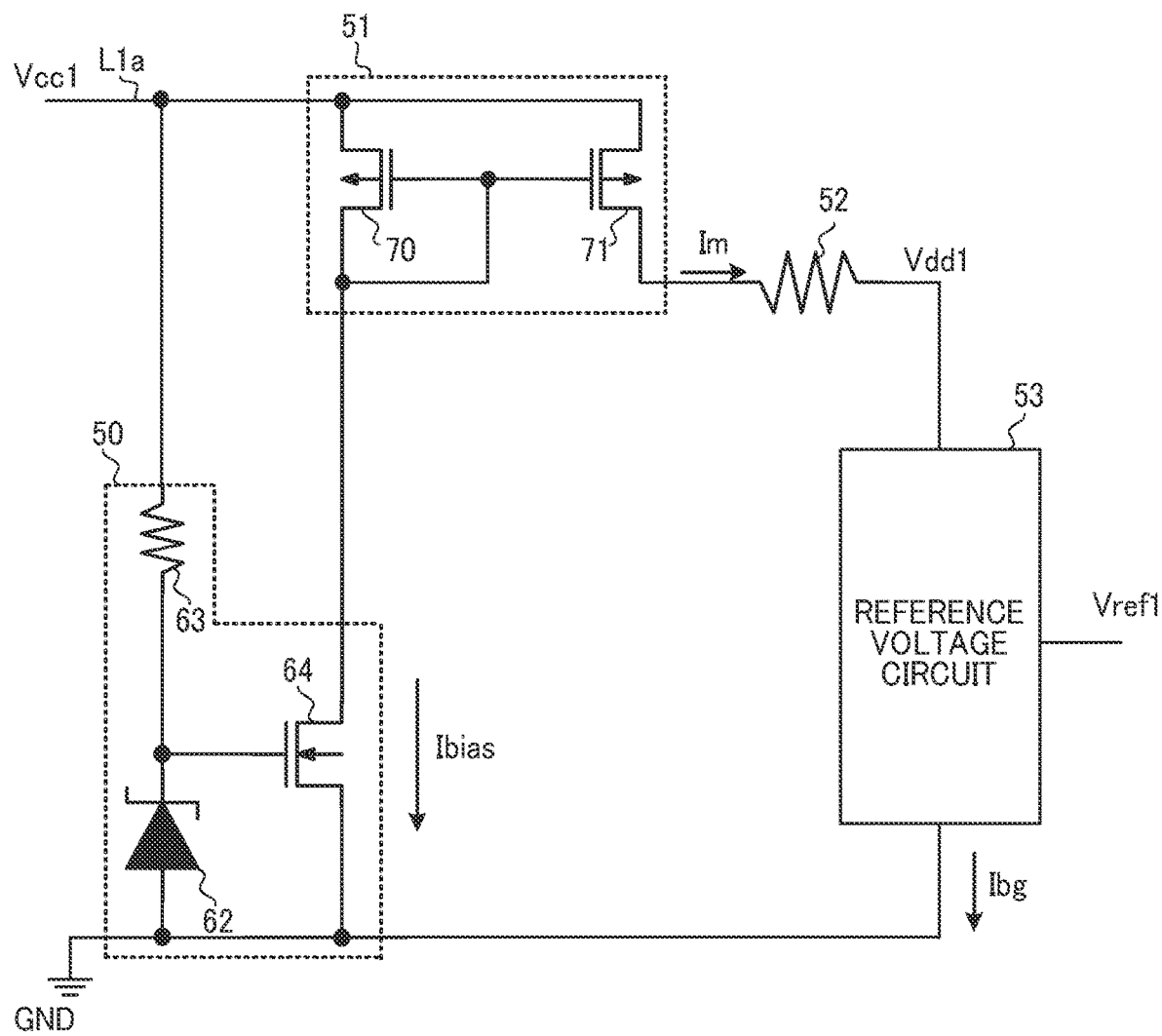
FIG. 9A illustrates an example of a circuit diagram of a voltage generator circuit 40c.

FIG. 9A illustrates an example of a circuit diagram of a voltage generator circuit 40c. The following mainly describes differences between the voltage generator circuit 40c and the voltage generator circuit 40a. A bias current source 50b of the voltage generator circuit 40c includes a Zener diode 62, a resistor 63, and an MOS transistor 64.

The Zener diode 62 and the resistor 63 coupled in series are provided between the line L1a to which the power supply voltage Vcc1 is applied and the ground. Here, the power supply voltage Vcc1 is higher than the Zener voltage of the Zener diode 62, and thus the gate voltage of the MOS transistor 64 results in the Zener voltage.

With provision of the Zener diode 62 as such, it is possible to apply steady-state voltage to the gate terminal of the MOS transistor 64 even when the power supply voltage Vcc1 fluctuates.

The resistor 63 adjusts the current supplied from the power supply voltage Vcc1 to the Zener diode 62. The resistor 63 is electrically coupled between the gate terminal of the MOS transistor 64 and the power supply line L1a.

The MOS transistor 64 generates the bias current Ibias between the drain and source thereof, based on the voltage generated from the Zener diode 62. Note that since the stable Zener voltage is applied from the Zener diode 62 to the MOS transistor 64, the bias current Ibias outputted from the MOS transistor 64 is stabilized.

The Zener diode 62 according to an embodiment of the present disclosure is an example of a "second Zener diode", and the MOS transistor 64 is an example of a "third MOS transistor".

Configuration of Voltage Generator Circuit 40d

Figure 9B:
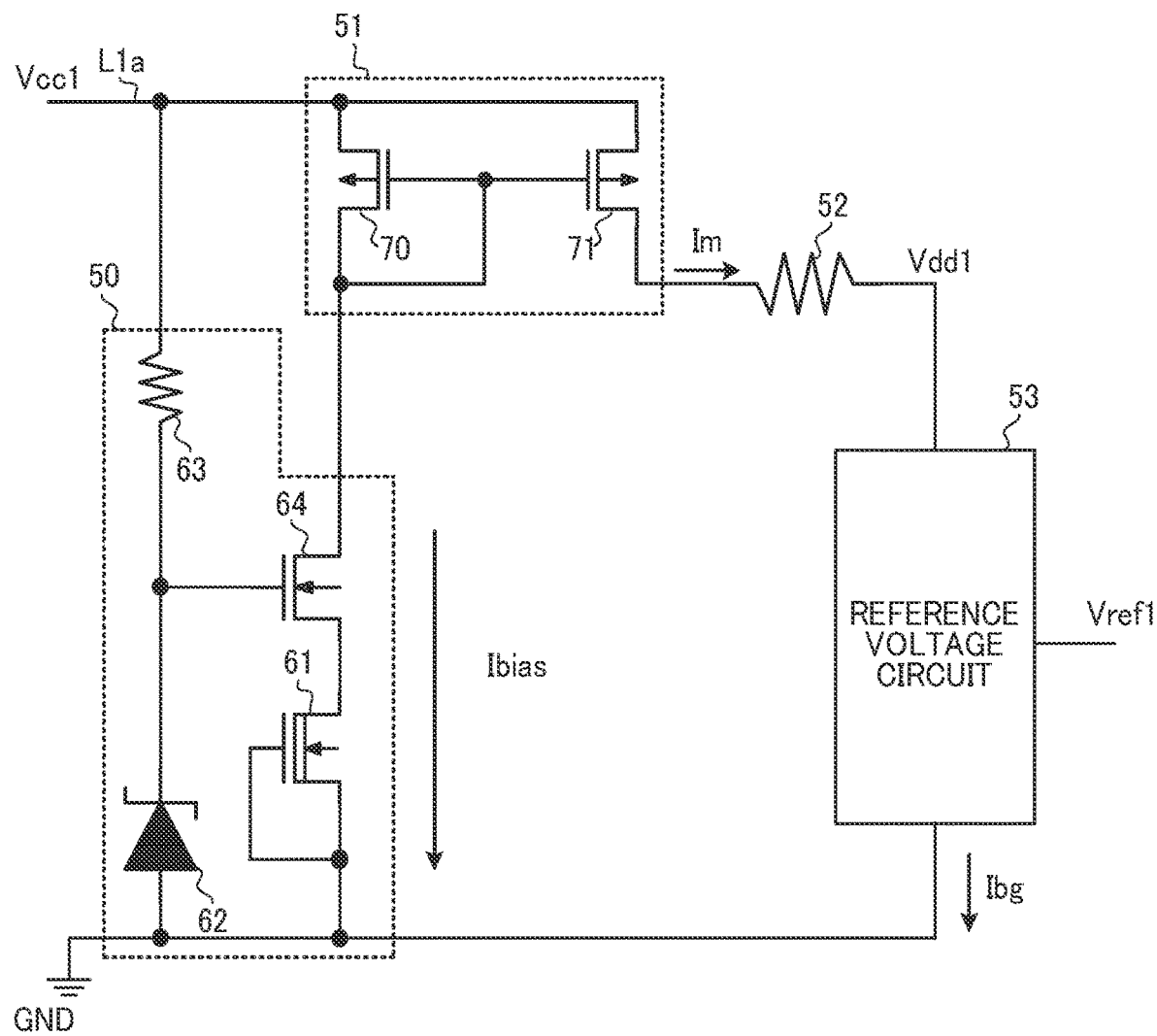
FIG. 9B illustrates an example of a circuit diagram of a voltage generator circuit 40d.

FIG. 9B illustrates an example of a circuit diagram of a voltage generator circuit 40d. The following mainly describes differences between the voltage generator circuit 40d and the voltage generator circuit 40a. A bias current source 50c of the voltage generator circuit 40d further includes the diode-coupled depletion type MOS transistor 61, the Zener diode 62, the resistor 63, and the MOS transistor 64.

Similarly to the case of FIG. 9A, the Zener diode 62 and the resistor 63 coupled in series are provided between the line L1a to which the power supply voltage Vcc1 is applied and the ground. Accordingly, the Zener voltage is applied to the MOS transistor 64.

The depletion type MOS transistor 61 is diode-coupled, and thus functions as a device to cause the magnitude of the drain-source current of the MOS transistor 64 to be the desired bias current Ibias.

Further, in an embodiment of the present disclosure, the depletion type MOS transistor 61 and the MOS transistor 64 operate as so-called source follower. Thus, the voltage corresponding to the Zener voltage is applies to the drain of the depletion type MOS transistor 61. Accordingly, even if the level of the power supply voltage Vcc1 is high, the stable bias current Ibias can be generated.

The Zener diode 62 according to an embodiment of the present disclosure is another example of the "second Zener diode", and the MOS transistor 64 is another example of the "third MOS transistor".

Configuration of Voltage Generator Circuit 40e

Figure 10A:
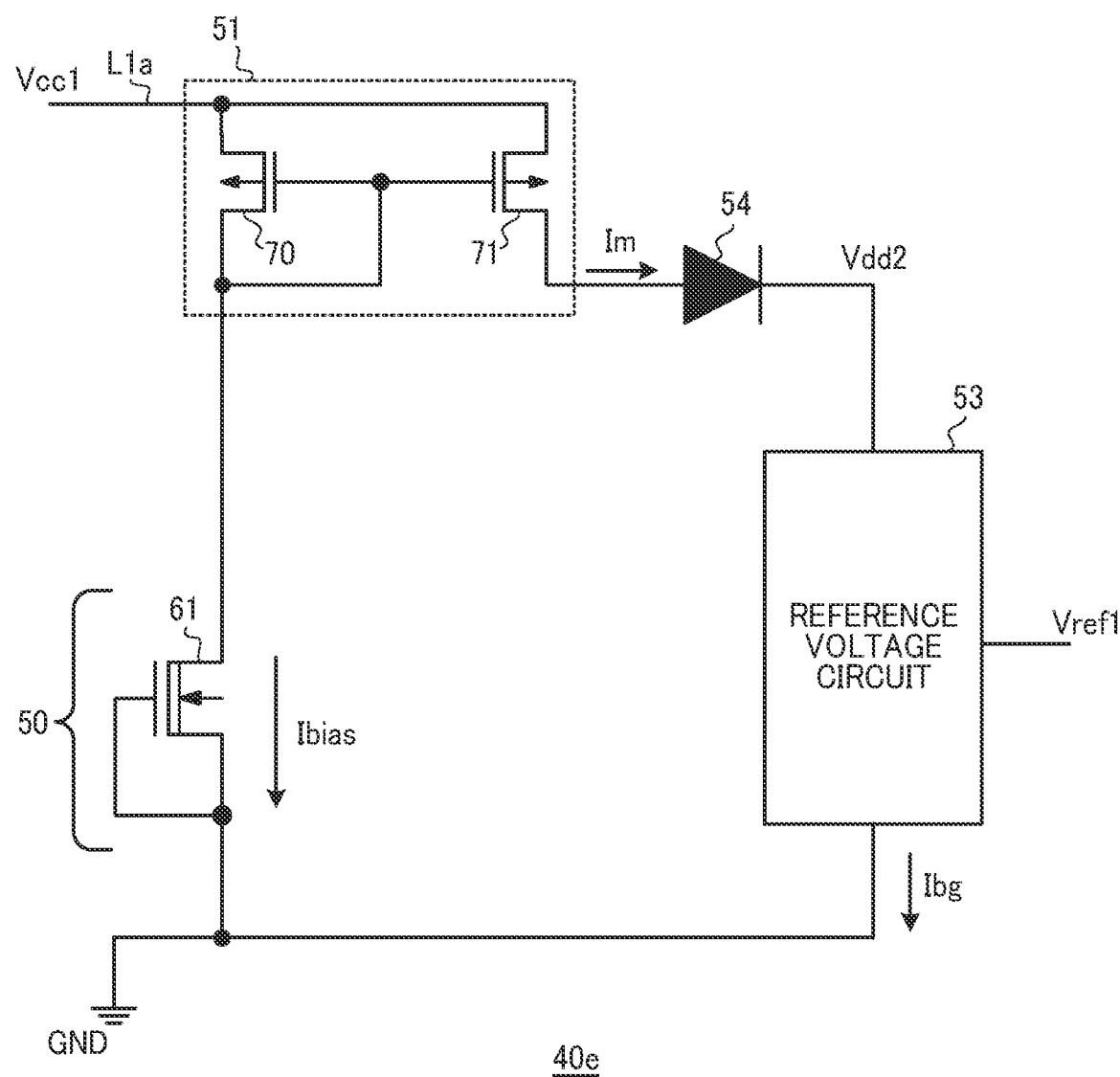
FIG. 10A illustrates an example of a circuit diagram of a voltage generator circuit 40e.

FIG. 10A illustrates an example of a circuit diagram of a voltage generator circuit 40e. The following mainly describes differences between the voltage generator circuit 40e and the voltage generator circuit 40a. The voltage generator circuit 40e includes a diode 54 in place of the resistor 52.

The diode 54 has an anode coupled to the current mirror circuit 51, and a cathode coupled to the reference voltage circuit 53. Assuming that a drop in the drain-source voltage in the MOS transistor 71 of the current mirror circuit 51 is Vds, a difference Vcc1−Vds obtained by subtracting the voltage Vds from the power supply voltage Vcc1 is applied to the anode of the diode 54.

From the cathode of the diode 54, a voltage Vdd2 (=Vcc1−Vds−0.7 [V]), which is lower than Vcc1−Vds by a forward voltage (here, 0.7 V) is outputted. Even in such a case, the constant current Im and the voltage Vdd2 to operate the reference voltage circuit 53 are supplied to the reference voltage circuit 53. Accordingly, the voltage generator circuit 40e according to an embodiment of the present disclosure can also improve the temperature characteristics of the reference voltage circuit 53.

Configuration of Voltage Generator Circuit 40f

Figure 10B:
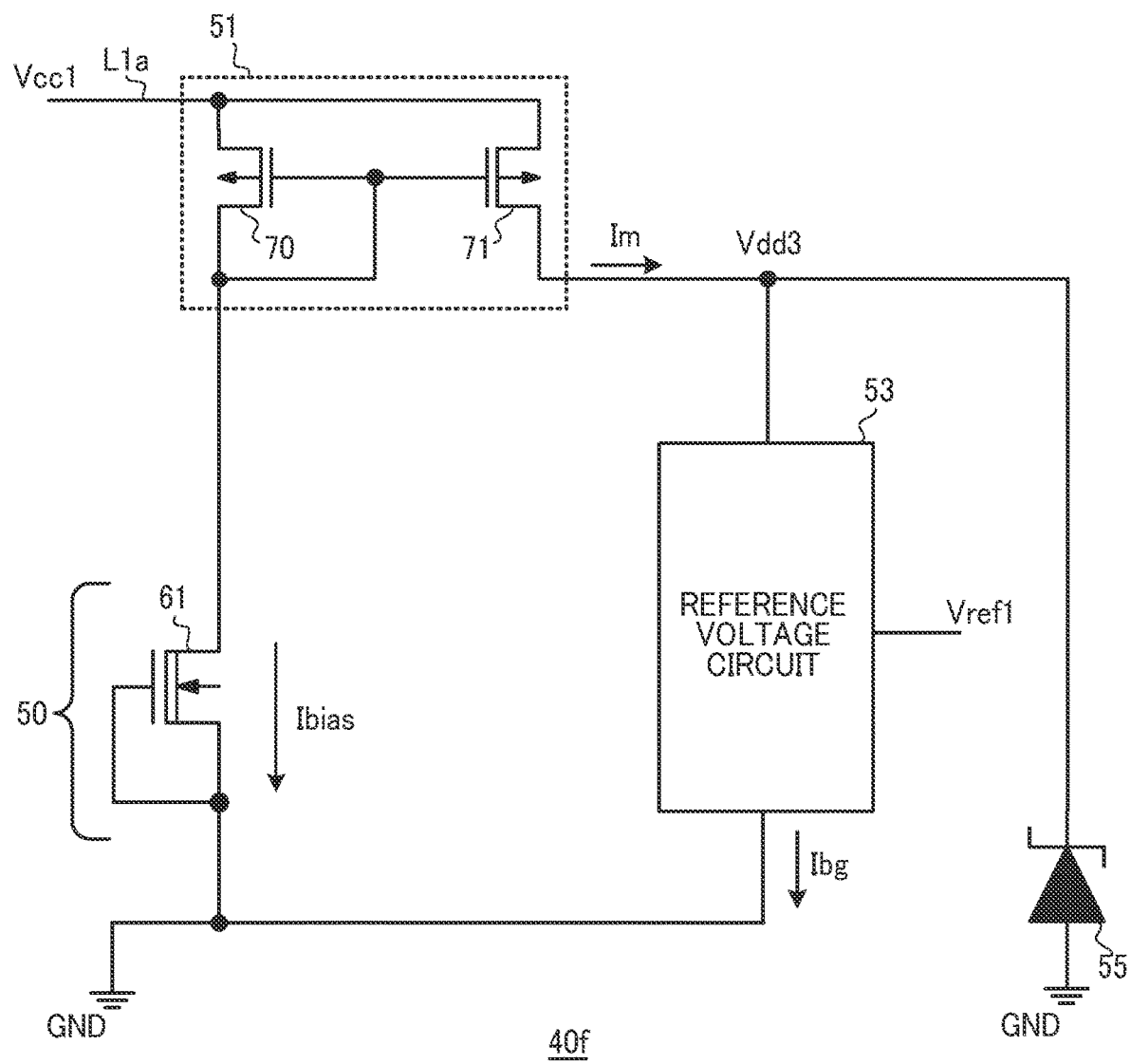
FIG. 10B illustrates an example of a circuit diagram of a voltage generator circuit 40f.

FIG. 10B illustrates an example of a circuit diagram of a voltage generator circuit 40f. The following mainly describes differences between the voltage generator circuit 40f and the voltage generator circuit 40a. The voltage generator circuit 40f includes a Zener diode 55 without including the resistor 52.

In an embodiment of the present disclosure, the Zener diode 55 has a cathode coupled to the current mirror circuit 51, and an anode that is grounded, such that the reference voltage circuit 53 and the Zener diode 55 are coupled in parallel. Accordingly, a Zener voltage Vdd3 of the Zener diode 55 is supplied to the reference voltage circuit 53.

The voltage generator circuit 40f as such can lower the voltage to operate the reference voltage circuit 53 while supplying constant current to the reference voltage circuit 53. Accordingly, in an embodiment of the present disclosure, even when the temperature changes, the reference voltage Vref1 from the reference voltage circuit 53 can be stabilized.

Even in this embodiment of the present disclosure as well, the voltage generator circuit 40f results in a circuit in which the current Im being constant current and the voltage Vdd3 being constant voltage are inputted to the reference voltage circuit 53, and the temperature characteristics of the reference voltage circuit 53 are stabilized. The Zener diode 55 according to an embodiment of the present disclosure corresponds to a "first Zener diode".

Configuration of Voltage Generator Circuit 40g

Figure 10C:
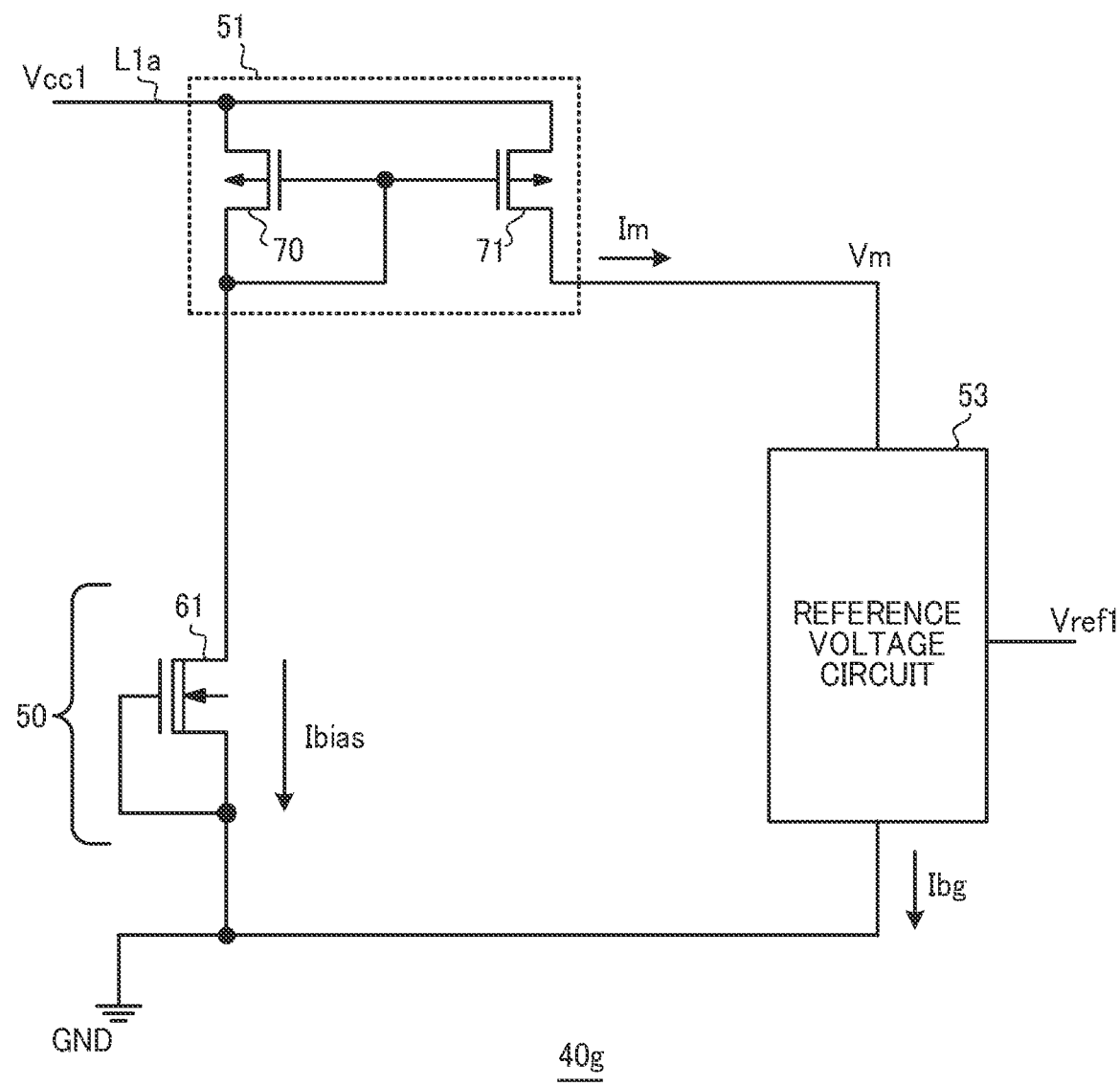
FIG. 10C illustrates an example of a circuit diagram of a voltage generator circuit 40g.

FIG. 10C illustrates an example of a circuit diagram of a voltage generator circuit 40g. The following mainly describes differences between a voltage generator circuit 40g and the voltage generator circuit 40a.

In the voltage generator circuit 40g, the reference voltage circuit 53 is directly electrically coupled to the output from the MOS transistor 71 out of the outputs of the current mirror circuit 51.

Even without the resistor 52 being provided, the current Im from the current mirror circuit 51 to the reference voltage circuit 53 is limited, and thus change with temperature in the reference voltage Vref1 of the voltage generator circuit 40g is smaller than change with temperature in the reference voltage Vref1 of the voltage generator circuit 110. In other words, in the voltage generator circuit 40g according to an embodiment of the present disclosure, the temperature characteristics are improved as compared with the voltage generator circuit 110 in FIG. 6.

Further, the current mirror circuit 51 has an internal resistance, and thus by appropriately setting the internal resistance of the current mirror circuit 51, it is possible to lower voltage Vm outputted from the current mirror circuit 51. Accordingly, when the internal resistance is adjustable, the same effects can be achieved according to this embodiment of the present disclosure as well, as in such an embodiment including the resistor 52.

SUMMARY

Hereinabove, the semiconductor module 10 according to an embodiment of the present disclosure has been explained. For example, as illustrated in FIG. 1, the integrated circuit 22a of the semiconductor module 10 includes the voltage generator circuit 40a electrically coupled to the power supply line L1a to which the power supply voltage Vcc1 is to be applied.

For example, as illustrated in FIG. 2, in the voltage generator circuit 40a, the current mirror circuit 51 supplies constant current to the reference voltage circuit 53. Accordingly, in the voltage generator circuit 40a of the integrated circuit 22a, the voltage value of the reference voltage Vref1 outputted from the reference voltage circuit 53 is stabilized even when the temperature is high with a small circuit configuration, thereby being able to improve the temperature characteristics of the reference voltage circuit 53.

For example, as illustrated in FIG. 2, the voltage generator circuit 40a may include the resistor 52 to supply the voltage Vdd1 to the reference voltage circuit 53. Accordingly, in the voltage generator circuit 40a of the integrated circuit 22a, the voltage Vdd1 to be inputted to the reference voltage circuit 53 results in a low voltage, thereby being able to further improve the temperature characteristics of the reference voltage circuit 53.

For example, as illustrated in FIG. 10A, the voltage generator circuit 40e may include the diode 54 to supply the voltage Vdd2 to the reference voltage circuit 53. Accordingly, in the voltage generator circuit 40e of the integrated circuit 22a, the voltage exceeding the forward voltage is applied to the diode 54, thereby being able to improve the temperature characteristics of the reference voltage circuit 53.

For example, as illustrated in FIG. 10B, the voltage generator circuit 40f may include the Zener diode 55 to supply the voltage Vdd3 to the reference voltage circuit 53. Accordingly, in the voltage generator circuit 40f of the integrated circuit 22a, the temperature characteristics of the reference voltage circuit 53 can be improved in a range in which the Zener diode 55 can be maintained in a breakdown state.

For example, as illustrated in FIG. 3, the reference voltage circuit 53 may be a bandgap circuit including bipolar devices such as the bipolar transistor 86 and the bipolar transistor 87. In the reference voltage circuit 53 as such, the surface area of the PN junction portion is large as illustrated in FIG. 4, and thus it is effective to reduce the leakage current.

For example, as illustrated in FIG. 5, the current Im is determined such that the current Ibg is limited to the value of the current Im. This can stabilize the reference voltage Vref1, thereby being able to improve the temperature characteristics of the reference voltage circuit 53.

For example, as illustrated in FIG. 7, when the temperature is higher than the temperature threshold value Tth, the current value of the current Im supplied by the current mirror circuit 51 of the voltage generator circuit 40a to the reference voltage circuit 53 is smaller than the current value of the current Icc1 supplied from the power supply line L1a to the reference voltage circuit 53 in a state where the reference voltage circuit 53 is coupled to the power supply line L1a as in the voltage generator circuit 110.

As such, the voltage generator circuit 40a of the integrated circuit 22a can be designed such that the current supplied to the reference voltage circuit 53 is small.

For example, as illustrated in FIG. 2, the voltage generator circuit 40a of the integrated circuit 22a may include the bias current source 50a. In this case, the constant current source of the voltage generator circuit 40a may be the current mirror circuit 51 including the MOS transistor 70 through which the bias current Ibias of the bias current source 50a is to flow, and the MOS transistor 71 to supply the constant current Im to the reference voltage circuit 53, without including a bipolar transistor.

Accordingly, in the voltage generator circuit 40a of the integrated circuit 22a, the leakage current is less likely to be generated from the current mirror circuit 51, which makes it easier to supply constant current to the reference voltage circuit 53. Accordingly, the temperature characteristics of the reference voltage circuit 53 can be improved.

For example, as illustrated in FIG. 9A or 9B, the bias current source 50 may include the Zener diode 62 and the MOS transistor 64 to generate the bias current Ibias, based on the voltage generated at the Zener diode 62.

Accordingly, the voltage generator circuit 40a of the integrated circuit 22a can provide the stable bias current Ibias even when the power supply voltage Vcc1 fluctuates.

For example, as illustrated in FIG. 2 or 9B, the bias current source 50 may include the diode-coupled depletion type MOS transistor 61. This makes it possible for the voltage generator circuit 40a or 40d of the integrated circuit 22a to generate the desired bias current Ibias even at a low voltage with a small circuit configuration.

For example, as illustrated in FIG. 3, the reference voltage circuit 53 may be such a circuit that includes the current source 88, the current source 89, the bipolar transistor 86 to which the current from the current source 88 is to be supplied, the resistor 85 to which the current from the current source 89 is to be supplied, the bipolar transistor 87 to be electrically coupled to the resistor 85, and that is configured to output the temperature-compensated reference voltage Vref1.

In this case, the voltage generator circuit 40a of the integrated circuit 22a can output such reference voltage Vref1 that the effects of respective temperature coefficients of the bipolar transistors 86 and 87 are compensated in a temperature range in which no leakage current is generated from the bipolar transistors 86 and 87.

For example, as illustrated in FIG. 1, the semiconductor module 10 includes an integrated circuit 22 according to an embodiment of the present disclosure. This makes it possible to utilize the reference voltage Vref1 of the reference voltage circuit 53 with temperature characteristics thereof improved, in the semiconductor module 10.

The present disclosure is directed to provision of an integrated circuit capable of stabilizing an output of a reference voltage circuit even when a temperature rises.

It is possible to provide an integrated circuit capable of stabilizing an output of a reference voltage circuit even when a temperature rises.

Hereinabove, the present disclosure has been described using embodiments. However, the technical scope of the present disclosure is not limited to the range described in above embodiments. It is apparent to those skilled in the art that above embodiments can be variously altered and modified. It is apparent from the claims that the technical scope of the present disclosure includes such altered or modified modes and equivalents thereof without departing from its essential features of the present disclosure.

It should be noted that processes such as operations, procedures, steps, stages, and the like in a device, a system, a program, and a method described in the claims, the specification, and the drawings may be performed in any order, unless a term such as "before", "prior to" or the like is explicitly used or an output of a previous process is used in a subsequent process. Even if terms such as "first", "next", and/or the like is used, for convenience, with respect to an operation flow in the claims, the specification, and the drawings, this does not mean that the flow needs to be performed in this order.

What is claimed is:

1. An integrated circuit comprising:
   a power supply line configured to receive a power supply voltage;
   a constant current source electrically coupled to the power supply line;
   a reference voltage circuit electrically coupled to the constant current source; and
   a first resistor having two ends, one end thereof being electrically coupled to the constant current source, and the other end thereof being electrically coupled to the reference voltage circuit, wherein
   the reference voltage circuit is a bandgap circuit including a plurality of bipolar devices, and
   the first resistor is configured to decrease a leakage current in the plurality of bipolar devices when a temperature rises.

2. The integrated circuit according to claim 1, wherein a current value of the constant current source is determined such that a current value of a current flowing from the reference voltage circuit to a ground is limited to a current value of the constant current source, when the temperature is equal to or higher than a predetermined temperature at which the leakage current is generated.

3. The integrated circuit according to claim 1, wherein a current value of a first current, which is supplied to the reference voltage circuit by the constant current source when the temperature is a predetermined temperature, is smaller than a current value of a second current, which is supplied from the power supply line to the reference voltage circuit when the temperature is the predetermined temperature, in a state where the reference voltage circuit is coupled to the power supply line.

4. The integrated circuit according to claim 1, wherein the integrated circuit includes a bias current source, and the constant current source includes
- a first metal-oxide-semiconductor (MOS) transistor allowing a bias current of the bias current source to flow therethrough, and
- a second MOS transistor configuring a current mirror circuit with the first MOS transistor, the second MOS transistor being configured to supply a constant current to the reference voltage circuit.

5. The integrated circuit according to claim 4, wherein the bias current source includes
- a second Zener diode, and
- a third MOS transistor configured to generate the bias current, based on a voltage generated at the second Zener diode.

6. The integrated circuit according to claim 4, wherein the bias current source includes a diode-coupled depletion type MOS transistor.

7. The integrated circuit according to claim 1, wherein the reference voltage circuit includes
- a first current source configured to receive a current from the constant current source,
- a second current source configured to receive the current from the constant current source, the second current source being electrically coupled in parallel with the first current source,
- a first bipolar transistor electrically coupled in series to the first current source,
- a second resistor electrically coupled in series to the second current source, and
- a second bipolar transistor electrically coupled in series to the second resistor, and the reference voltage circuit is configured to output a voltage at the second resistor as a temperature-compensated reference voltage.

8. A semiconductor module, comprising the integrated circuit according to claim 1.

9. An integrated circuit comprising:
a power supply line configured to receive a power supply voltage;
a constant current source electrically coupled to the power supply line;
a reference voltage circuit electrically coupled to the constant current source; and
a diode having
- an anode electrically coupled to the constant current source, and
- a cathode electrically coupled to the reference voltage circuit, wherein the integrated circuit includes a bias current source, and the constant current source includes
- a single first metal-oxide-semiconductor (MOS) transistor allowing a bias current of the bias current source to flow therethrough, and
- a single second MOS transistor configuring a current mirror circuit with the single first MOS transistor, the single second MOS transistor being configured to supply a constant current to the anode of the diode; and the reference voltage circuit includes
- a first current source configured to receive a current from the constant current source,
- a second current source configured to receive the current from the constant current source, the second current source being electrically coupled in parallel with the first current source,
  - a first bipolar transistor electrically coupled in series to the first current source,
  - a second resistor electrically coupled in series to the second current source, and
  - a second bipolar transistor electrically coupled in series to the second resistor,
the reference voltage circuit being configured to output a voltage at the second resistor as a temperature-compensated reference voltage.

10. An integrated circuit comprising:
a power supply line configured to receive a power supply voltage;
a constant current source electrically coupled to the power supply line; and
a reference voltage circuit and a first Zener diode connected in parallel, both being electrically coupled between the constant current source and a ground, wherein
the first Zener diode has
- a cathode electrically coupled to the reference voltage circuit and the constant current source, and
- an anode that is grounded, such that a Zener voltage of the first Zener diode is supplied directly to the reference voltage circuit as a voltage to operate the reference voltage circuit, and
the reference voltage circuit is a bandgap circuit including a plurality of bipolar devices, the reference voltage circuit generating a reference voltage based on the Zener voltage.

11. The integrated circuit of claim 10, further comprising:
a bias current source, wherein
the constant current source includes
- a first metal-oxide-semiconductor (MOS) transistor allowing a bias current of the bias current source to flow therethrough, and
- a second MOS transistor configuring a current mirror circuit with the first MOS transistor, the second MOS transistor being configured to supply a constant current to the reference voltage circuit.

* * * * *